United States Patent [19]
Wilson

[11] Patent Number: 4,731,791
[45] Date of Patent: Mar. 15, 1988

[54] BURIED HETERO-STRUCTURE LASER DIODE

[75] Inventor: Randall B. Wilson, Maple Wood, N.J.

[73] Assignee: Lytel Incorporated, Sommerville, N.J.

[21] Appl. No.: 869,002

[22] Filed: May 30, 1986

[51] Int. Cl.$^4$ .................... H01S 3/19; H01L 33/00
[52] U.S. Cl. .................... 372/48; 357/17; 372/46
[58] Field of Search .................. 372/44, 45, 46, 48; 357/17

[56] References Cited

U.S. PATENT DOCUMENTS

| | | | |
|---|---|---|---|
| 4,425,650 | 1/1984 | Mito et al. | 357/17 |
| 4,426,701 | 1/1984 | Botez | 372/48 |
| 4,429,397 | 1/1984 | Sugimoto et al. | 372/46 |
| 4,525,841 | 6/1985 | Kitamura et al. | 372/46 |

FOREIGN PATENT DOCUMENTS 0125684   7/1984   Japan ................................ 372/45

OTHER PUBLICATIONS

Mito, et al., "In Ga Asp Double-Channel-Planar-Buried, etc.", 1983, pp. 195-202, IEEE J. of Lightwave Tech., vol. LT-3.
Kuindersma, et al., "1, 3 um Buried Heterojunction, etc.", 1985, pp. 726-736, IEEE J. of Quan. El., vol. QE-21.
Kitamura, et al., "Lasing Mode, etc.", 1985, pp. 415-417, IEEE J. of Quan. El., vol. QE-21.
Kitamura, et al., "High-Performance, etc." 1984, pp. 363-369, IEEE J. of Lightwave Tech, vol. LT-2.
Katsumi, et al., "Fabrication and Lasing, etd.". 1980, pp. 160-164, IEEE J. of Quan. El., vol. QE-16.
Oron, et al., "Lasing Properties, etc.", 1982, pp. 609-611, App. Phys. Lett., vol. 41.
Mito et al., "Double-Channel etc.", 1982, pp. 953-954, Electronics Letters, vol. 18.
Kishino et al., "Mesa-Substrate etc.", 1979, pp. 134-136, Electronics Letters, vol. 15.
Mito et al., "In GaAsP Planar etc." 1982, pp. 2-3, Electronics Letters, vol. 18.
Yamaguchi et al.m " Wide Range Wavelength etc.", 1985, pp. 63-65, Electronics Letters, vol. 21.
Tamari et al., "lnGa AsP Mesa- Substrate etc.", 1982, pp. 177-178, Electronics Letters, vol. 18.
Mito et al., "Highly Reliable DC-PBH LD etc.", 1985, pp. 14-22, NEC Res S. Dev. No. 78.
Mito et al., "ln Ga As P Planar etc.", 1981, pp. 7-14, Elec. com. Soc-Japan, (Translation).
Nomura et al., "In Ga As P Current Confinement etc.," 1981, Elec. Com. Soc-Japan, (Translation).
Mito et al., "High Efficiency and High Power ln Ga As P etc." 1983, CLEO in Baltimore, Maryland.
Seki et al., "Highly Stable Operation etc.", 1983, CLEO in Baltimore, Maryland.
Mito et al., "High $T_o$ and High Temperature etc.", pp. 82-83.

Primary Examiner—James W. Davie
Assistant Examiner—Georgia Y. Epps
Attorney, Agent, or Firm—Marmorek, Guttman & Rubenstein

[57] ABSTRACT

A buried hetero-structure laser diode is disclosed. The buried hetero-structure is formed by growing a double hetero-structure on a substrate. The double hetero-structure comprises two cladding layers spaced apart by a narrow bandgap active layer. Two spaced apart channels are etched in the double hetero-structure down to the lower cladding layer to define a mesa therebetween. Current blocking layers are deposited in the channels and on the portions of the double hetero-structure located outside the channels. The liquid phase epitaxy growth conditions are such that while the blocking layers are deposited in the channels and outside the channels, the upper cladding layer portion of the mesa is being melted back. Thus, the ends of the blocking layers touching the melted back mesa are separated from the active layer portion of the mesa by a thickness substantially less than the thickness of the upper cladding layer as measured in the regions outside the channels.

3 Claims, 2 Drawing Figures

PRIOR ART

BURIED HETERO-STRUCTURE LASER DIODE

FIELD OF THE INVENTION

This invention relates to a buried hetero-structure laser diode. (BHLD).

BACKGROUND OF THE INVENTION

Kitamura et al U.S. Pat. No. 4,525,841 discloses a buried hetero-structure semiconductor laser diode comprising a semiconductor substrate of a first conductivity type. On top of the substrate, a first cladding layer of a first conductivity type is formed followed by an active semiconductor layer and a second cladding semiconductor layer of a second conductivity type. The active semiconductor layer has a narrower bandgap than the first and second cladding layers. The buried hetero-structure has a stripe geometry active region, with channels formed along both sides of the stripe and extending down to the first cladding layer. Thus, the channels formed in the double hetero-structure define a mesa which includes a small portion of the first or lower cladding layer, a portion of the active layer and a portion of the second or upper cladding layer. Current blocking layers are formed in the channels and on the portion of the double hetero-structure outside the channels, but not on top of the mesa located between the channels. The blocking layers serve to confine the current flow to that portion of the active layer incorporated into the mesa.

Such a structure may be manufactured as follows. The double hetero-structure is formed by successively growing on a (100) oriented n-InP substrate an n-InP cladding layer (5 microns thick, Sn-doped, $1 \times 10^{18}$ cm$^{-3}$) a non-doped $In_{0.72}Ga_{0.28}As_{0.61}P_{0.39}$ active layer (0.1 micron thick) and a p-InP cladding layer (1 micron, thick Zn doped, $1 \times 10^{18}$ cm$^{-3}$). The active layer corresponds to an emitting wavelength of 1.3 microns. The double hetero-structure wafer is treated with a usual photoresist and chemical etching process to form two parallel channels in the <011> direction with a mesa stripe therebetween. The channels extend into the n-InP cladding layer. The mesa stripe may be 1.5 microns wide in the active layer portion and the channels may be about 10 microns wide and 3 microns deep.

Epitaxial growth is carried out on the etched semiconductor wafer to successively form a p-type blocking layer and an n-type blocking layer on the surface of the semiconductor wafer except for the top surface of the mesa. A p-InP embedding layer and a quaternary electrode layer are subsequently formed throughout the entire wafer surface.

The p- and n- InP blocking layers are produced by liquid phase epitaxial growth employing a two-phase solution in which a single InP crystal floats in an In growth melt. Selective epitaxial growth (i.e., no growth on the mesa) is achieved because the growth proceeds so fast at the sides of the mesa that phosphorus a minor atom contained in the melt, has a relatively high concentration at the sides of the mesa and is relatively depleted near the top of the mesa. Such a growth process is disclosed in Mito et al U.S. Pat. No. 4,425,650. After the embedding growth, the wafer is processed into the desired buried hetero-structure laser diode by forming electrodes and a pair of reflective end surfaces which function as a resonator by the cleavage of (011) surfaces followed by pelletization.

As a result of the two phase liquid phase epitaxy growth process used to form the blocking layers, the ends of the blocking layers are pinned adjacent to the top of the mesa and, are vertically separated from the active layer portion of the mesa by the height of the upper p-type cladding layer. Such a structure has an undesirably high leakage current.

It is an object of the present invention to provide a buried hetero-structure laser diode in which the vertical distance between the ends of the current blocking layers adjacent to the top of the mesa and the active layer portion of the mesa is smaller than the thickness of the upper cladding layer so that substantially reduced leakage current results.

SUMMARY OF THE INVENTION

This object may be achieved by growing the p and n current blocking layers under the following growth conditions. While the current blocking layers are being deposited in the channels and on the portion of the double hetero-structure outside the channels, the portion of upper cladding layer forming the top of the mesa is being melted back a controlled amount. This results in the ends of the blocking layers touching the top of the melted back mesa being vertically separated from the active layer portion of the mesa by an amount relatively small compared to the thickness of the upper cladding layer. A buried hetero-structure laser diode exhibiting reduced leakage currents in comparison to the prior art buried hetero-structure laser diode described above is achieved.

Illustratively, in the present invention the p- and n-InP blocking layers are grown using single phase supersaturated solutions. By controlling these supersaturated solutions, it is possible to control the amount of melt back. Typically, the liquidus temperature for InP growth using liquid phase epitaxy is about 635 degrees. For mesas having top widths of between 0.7 and 1.7 microns, it is desirable to grow at temperatures between 10 degrees and 5 degrees below the liquidus point to produce the desired amount of melt back.

BRIEF DESCRIPTION OF THE DRAWINGS

Like elements in the drawings have the same identifying numerals. For purposes of clarity, the Figures are not drawn to scale.

DETAILED DESCRIPTION OF THE INVENTION

Before describing the buried hetero-structure laser diode of the present invention, it may be helpful to briefly review the prior art buried hetero-structure laser diode disclosed in the above-mentioned U.S. Pat. No. 4,525,841. The prior art structure is shown in FIG. 1.

Figure 1:
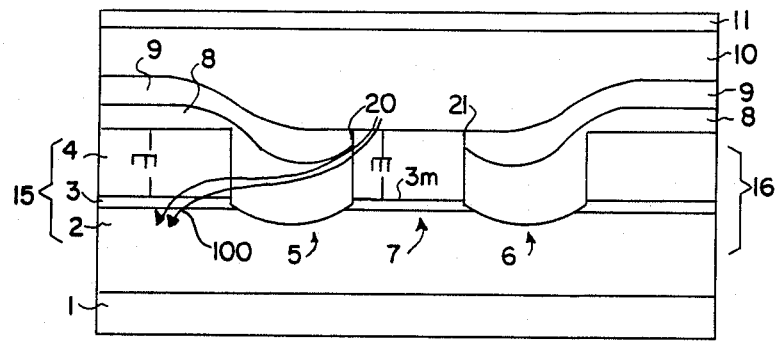
FIG. 1 shows a prior art buried hetero-structure laser diode.

In order to form the laser diode of FIG. 1, a double heterostructure is made by successively growing on a (100) oriented n-InP substrate 1, an n-InP cladding layer 2 (5 microns thick, Sn doped, $1 \times 10^{18}$ cm$^{-3}$) a non-doped $In_{0.72}Ga_{0.15}Al_{0.61}P_{0.39}$ active layer 3 (0.1 micron thick) and a p-InP cladding layer 4 micron thick, Zndoped, $1 \times 10^{18}$ cm$^{-3}$) The active layer 3, corresponds to an emitting wavelength of 1.3 microns.

The double hetero-structure wafer is treated with a usual photo resist and chemical etching process to form two parallel channels 5 and 6 in the <011> direction. A mesa stripe 7 is defined between the channels. The mesa 7 may be 1.5 microns wide in the active layer portion 3 m and the channels 5 and 6 may both be about 10 microns wide and about 3 microns deep.

A p-InP blocking layer 8 and an n-InP blocking layer 9 are successively grown on the etched double heterostructure wafer, except on the top surface of the mesa stripe 7. Thus, the blocking layers 8 and 9 cover the portions of the double hetero-structure 15 and 16 located outside the channels 5 and 6 and are formed within the channels 5 and 6. A p-InP embedding layer 10 and a $In_{0.85}Ga_{0.15}As_{0.33}P_{0.67}$ electrode layer 11 are formed over the entire surface of the wafer. The electrode layer 11 has a bandgap corresponding to the emitting wavelength of 1.1 microns.

The p and n-InP blocking layers 8,9 are both produced by liquid phase epitaxial growth employing a two phase solution in which a single InP crystal floats in an In growth melt. Selective epitaxial growth (i.e. no growth on top of the mesa) is possible because the growth proceeds so fast at the sides of the mesa 7 that phosphorus a minor element contained in the melt has a higher concentration near the side portions of the mesa and is depleted near the top of the mesa. This type of growth is described in the above-mentioned U.S. Pat. No. 4,425,650.

After growth of the layers 10 and 11, the wafer is processed into the desired buried hetero-structure laser diode by forming the electrodes and cleaving a pair of (011) surfaces to form a resonator.

As a result of the two phase growth process used to form the blocking layers 8 and 9, the ends of the blocking layers 20,21 adjacent to the top of the mesa 7 are vertically separated from the portion 3 m of the active layer 3 in the mesa by a thickness T equal to the thickness of the upper cladding layer 4. As stated previously, such a structure has an undesirably high leakage current. In the device of FIG. 1, the leakage currents follow the paths indicated by the arrow 100. The flow of leakage current may be substantially reduced, in accordance with the present invention by utilizing the structure of FIG. 2.

Figure 2:
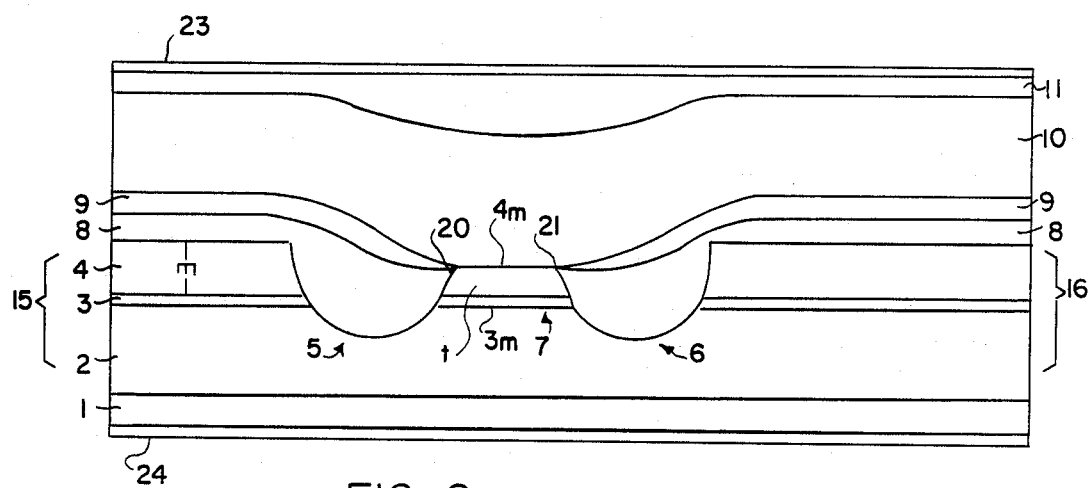
FIG. 2 shows a buried hetero-structure laser diode in accordance with an illustrative embodiment of the present invention.

Like the structure of FIG. 1, the buried hetero-structure laser diode of FIG. 2 is formed by first growing a double hetero-structure on an n- InP substrate 1. On the (100) oriented n-InP substrate 1, the n-InP cladding layer 2, the undoped InGaAsP active layer 3, and the p-InP cladding layer 4 are successively grown. A quaternary InGaAsP protective layer having a bandgap corresponding to 1.3 microns may be temporarily formed on top of the p-InP cladding layer 4 prior to etching of the channels 5 and 6 to prevent thermal decomposition of the InP cladding layer.

The quaternary protective layer is then stripped off using conventional material selective etchants and conventional photo lithography and etching techniques are used to define the channels 5 and 6.

However, the blocking layers 8 and 9 are not formed using the two- phase growth technique described above, which growth technique pins the ends of the blocking layers 20,21 at the top of the mesa 7, separated from the active layer portion 3m by the thickness T of the upper cladding layer.

Instead single phase liquid phase epitaxy is used to produce the blocking layers 8,9 of FIG. 2. The conditions of the single phase growth are as follows. While the current blocking layers 8 and 9 are being deposited in the channels 5 and 6 and on the portions of the double-hetero-structure 15,16 outside the channels, the portion 4 m of the upper cladding layer incorporated into the mesa is melted back a controlled amount. This results in the ends of the blocking layers 20,21 touching the top of the melted back mesa 7.

Thus, the ends 20,21 of the blocking layers 8,9 are separated from the active layer portion of the mesa by a thickness T which is significantly smaller than the thickness T of the upper cladding layer 4. For example, in the InGaAsP laser of FIG. 2, the upper cladding layer 4 has a thickness T of about 1 micron outside of the channels 5 and 6, while after melt back the mesa portion of the upper cladding layer 4m has a thickness t between 0.2 to 0.5 mkrms. Thus the ends 20,21 of the blocking layers 8,9 which are adjacent the top of the now melted back mesa are located substantially closer to the active layer portion 3 m than in the prior art structure, resulting in a laser with substantially reduced leakage current.

The amount of melt back depends on the growth temperature and the width of the mesa. Typically InP has a liquidus temperature of 635 degrees. For mesas having widths between 0.7 and 1.7 microns the p-and n-InP blocking layers 8,9 may be grown at temperatures between 10° and 5° below the liquidus temperature. This achieves a melt back of the mesa portion of the upper cladding layer while depositing the blocking layers 8,9 in the channels 5,6 and on the portions of the double-hetero-structure located outside the channels. Typically, most of the melt back occurs during the depositing of the p-InP blocking layer 8. Illustratively, growth times of 40 seconds and 60 seconds are used to grow a 1 micron thick p- blocking layer and a 1.7 micron thick n- blocking layer, respectively. The degree of melt back also depends on the concentration of p-impurities in the single phase InP solution used to grow the p-type blocking layer 8. Illustratively, the concentration of p-impurities should result in a p-InP blocking layer with a majority carrier concentration between $1 \times 10^{18}$ cm$^{-3}$ and $2 \times 10^{18}$ cm$^{-3}$. In alternative embodiments of the invention, the ends 20,21 of the blocking layers 8,9 may not be pinned even with the top of the melted back mesa, but instead the blocking layers may spill over and terminate on top of the melted back mesa or the blocking layers may terminate on the sides of the melted back mesa.

After the growth of the blocking layers 8 and 9, the embedding and electrode layers 10,11 are formed. After growth of the layers 10,11, the electrodes 23 and 24 formed and the wafer is cleaved to form a resonator.

Finally, the above-described embodiments of the invention are intended to be illustrative only. Numerous alternative embodiments may be devised without departing from the spirit and scope of the following claims.

What is claimed is:
1. In a buried hetero-structure laser diode comprising:
a substrate;
a plurality of layers on said substrates, said layers including an active layer capable of emitting radiation when a pumping current is applied thereto, a first cladding layer above said active layer, and a second cladding layer below said active layer;

first and second channels in said active layer and said cladding layers defining a mesa therebetween, the improvement comprises said mesa having a top in said first cladding layer and a height above said active layer less than the height of said first cladding above said active layer for portions of said first cladding layer outside said channels;

first blocking layer of one conductivity type on said first cladding layer;

second blocking layer of opposite conductivity type to said first blocking layer on said blocking layer and extending into said channels; and electrodes for receiving said pumping current;

both of said first and second blocking layers extending into said channels and terminating at the top of said mesa.

2. In a buried hetero-structure laser diode comprising:
a substrate,
a plurality of layers on said substrate said layers including an active layer capable of emitting radiation when a pumping current is applied thereto, a first cladding layer above said active layer, and a second cladding layer below said active layer;

first and second channels in said active layer and said cladding layers defining a mesa therebetween, the improvement comprises said mesa including a melted back portion of said first cladding layer and a portion of said active layer, and said mesa having a top in said first cladding layer and a height above said active layer less than the height of said first cladding layer above said active layer for portions of said first cladding layer outside said channels;

first blocking layer of one conductivity type on said first cladding layer;

second blocking layer of opposite conductivity type to said first blocking layer and extending into said channels; and electrodes for receiving said pumping current;

both of said first and second blocking layers extending into said channels and terminating at the top of said mesa.

3. The buried hetero-structure of claim 2 wherein said structure is formed in the InGaAsP materials system.

* * * * *